(12) United States Patent
Eid et al.

(10) Patent No.: US 11,621,208 B2
(45) Date of Patent: Apr. 4, 2023

(54) THERMAL MANAGEMENT SOLUTIONS THAT REDUCE INDUCTIVE COUPLING BETWEEN STACKED INTEGRATED CIRCUIT DEVICES

(71) Applicant: Intel Corporation, Santa Clara, CA (US)

(72) Inventors: Feras Eid, Chandler, AZ (US); Adel Elsherbini, Chandler, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 980 days.

(21) Appl. No.: 16/040,748

(22) Filed: Jul. 20, 2018

(65) Prior Publication Data

US 2020/0027812 A1 Jan. 23, 2020

(51) Int. Cl.
*H01L 23/367* (2006.01)
*H01L 25/065* (2006.01)
*H01L 23/498* (2006.01)

(52) U.S. Cl.
CPC ...... *H01L 23/367* (2013.01); *H01L 23/49838* (2013.01); *H01L 25/0657* (2013.01);
(Continued)

(58) Field of Classification Search
CPC .................................................... H01L 23/367
See application file for complete search history.

(56) References Cited

U.S. PATENT DOCUMENTS 7,705,449 B2 4/2010 Baek et al.
7,830,020 B2 11/2010 Dahilig et al.
(Continued)

FOREIGN PATENT DOCUMENTS

KR 100700936 3/2007

OTHER PUBLICATIONS

International Search Report and Written Opinion for International Patent Application No. PCT/US19/37782 notified Oct. 4, 2019.
(Continued)

*Primary Examiner* — William A Harriston
(74) *Attorney, Agent, or Firm* — Essential Patents Group, LLP.

(57) ABSTRACT

An integrated circuit assembly may be formed having a substrate, a first integrated circuit device electrically attached to the substrate, a second integrated circuit device electrically attached to the first integrated circuit device, and a heat dissipation device comprising at least one first thermally conductive structure proximate at least one of the first integrated circuit device, the second integrated circuit device, and the substrate; and a second thermally conductive structure disposed over the first thermally conductive structure(s), the first integrated circuit device, and the second integrated circuit device, wherein the first thermally conductive structure(s) have a lower electrical conductivity than an electrical conductivity of the second thermally conductive structure. The first thermally conductive structure(s) may be formed by an additive process or may be pre-formed and attached to at least one of the first integrated circuit device, the second integrated circuit device, and the substrate.

20 Claims, 11 Drawing Sheets

(52) U.S. Cl.
 CPC ............... *H01L 2225/06513* (2013.01); *H01L 2225/06517* (2013.01)

(56) References Cited

U.S. PATENT DOCUMENTS

| | | |
|---|---|---|
| 9,478,504 B1 | 10/2016 | Shen et al. |
| 2006/0118969 A1 | 6/2006 | Yuan |
| 2009/0057881 A1 | 3/2009 | Arana et al. |
| 2012/0043669 A1* | 2/2012 | Refai-Ahmed ......... H01L 23/04 257/777 |
| 2012/0292745 A1* | 11/2012 | Park .................... H01L 23/3128 257/E21.705 |
| 2014/0131854 A1 | 5/2014 | Hawk et al. |
| 2015/0001701 A1 | 1/2015 | Li et al. |
| 2015/0262972 A1 | 9/2015 | Katkar et al. |
| 2016/0247742 A1 | 8/2016 | Vadhavkar et al. |
| 2017/0148767 A1 | 5/2017 | Hung et al. |

OTHER PUBLICATIONS

International Preliminary Report on Patentability for PCT Application No. PCT/US19/37782, dated Feb. 4, 2021.
Office Action for U.S. Appl. No. 16/040,746, dated Jun. 27, 2022.
Restriction Requirement for U.S. Appl. No. 16/040,746, dated Jan. 25, 2022.
Final Office Action for U.S. Appl. No. 16/040,746, dated Feb. 21, 2023.

* cited by examiner

THERMAL MANAGEMENT SOLUTIONS THAT REDUCE INDUCTIVE COUPLING BETWEEN STACKED INTEGRATED CIRCUIT DEVICES

TECHNICAL FIELD

Embodiments of the present description generally relate to the removal of heat from integrated circuit devices, and, more particularly, to thermal management solutions that include structures that reduce inductive coupling between stacked integrated circuit devices within an integrated circuit device package.

BACKGROUND

Higher performance, lower cost, increased miniaturization, and greater packaging density of integrated circuits within integrated circuit devices are ongoing goals of the electronics industry. As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. This issue becomes even more critical when multiple integrated circuit devices are incorporated in a stacked configuration. As will be understood to those skilled in the art, when multiple integrated circuit devices are stacked, some of the integrated circuit devices will be "internally" positioned between an adjacent integrated circuit device and a substrate to which the stacked integrated circuit devices are attached or will be positioned between a pair of adjacent integrated circuit devices. As such, these internally positioned integrated circuit devices are partially isolated from thermal management solutions, such as heat spreaders, since the integrated circuit devices and/or the substrate to which the integrated circuit devices may be adjacent, are generally not efficient thermal conductors, nor are the various intervening layers, such as thermal interface material layers, underfill materials, and the like, which are between the internally positioned integrated circuit device and the thermal management solutions. This problem is exacerbated by thermal cross talk between the stacked integrated circuit devices and potential superposition of the hot spots due to the stacking, as will be understood to those skilled in the art. Thus, the internally positioned integrated circuit devices may exceed their temperature limits, which may require throttling (speed reduction of the integrated circuit devices) that can lead to reduced performance, or, in extreme cases, can lead to damage and failure of the entire integrated circuit package. Alternately, if the integrated circuits have thermal throttling control, they may reduce their operating frequency and, thus, their power to operate at lower temperature and avoid failures. However, this results in lower overall performance.

One method to reduce the temperature of internally positioned integrated circuit devices is to arrange the stacked integrated circuit devices such that a heat dissipation device can more directly contact each of the integrated circuit devices, such as depositing a highly thermally conductive material over the stacked integrated circuit devices. However, highly thermally conductive materials are generally highly electrically conductive, which can produce undesired inductive coupling between the integrated circuit devices, particularly with thin integrated circuit devices. As will be understood to those skilled in the art, such inductive coupling can diminish the performance of the integrated circuit devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
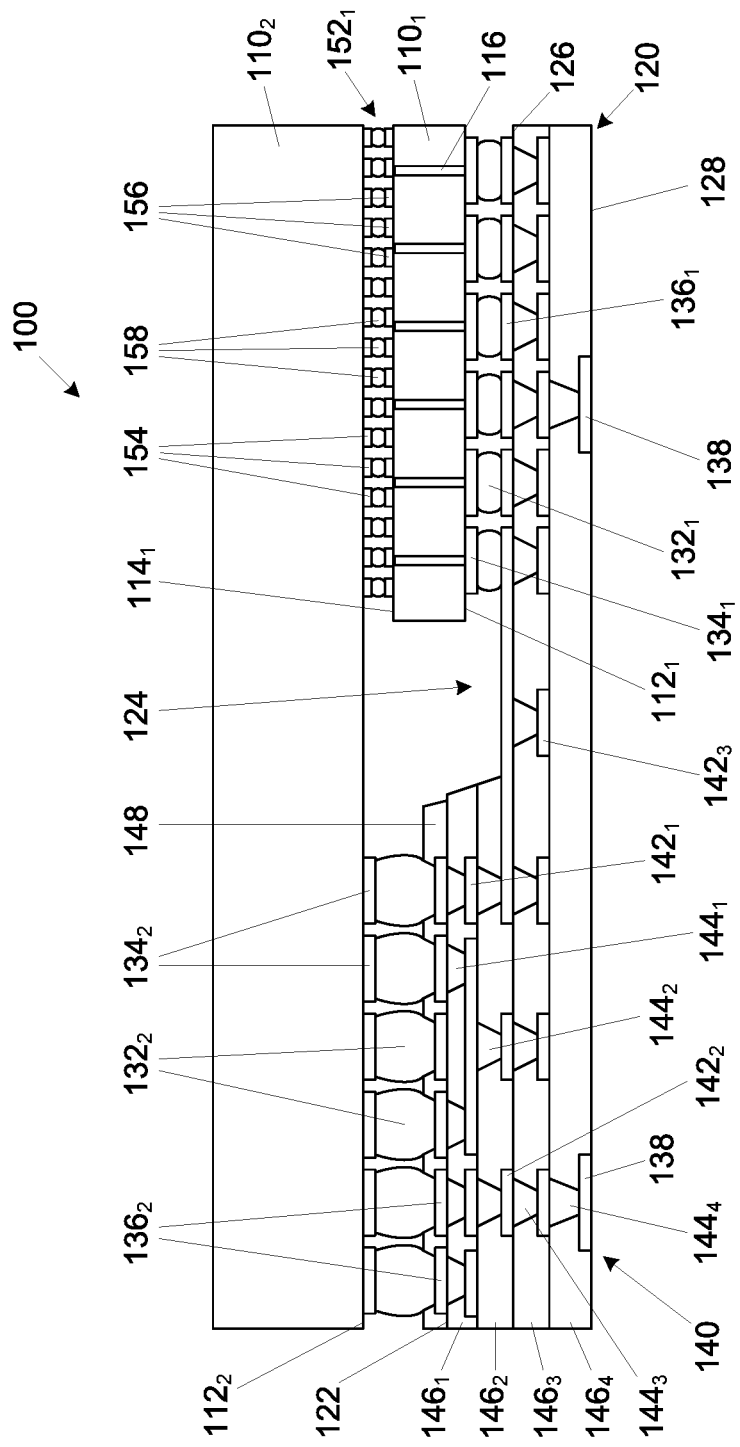
FIG. 1 is a side cross-sectional view of an integrated circuit stacked structure, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more integrated circuit devices by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit assembly having a substrate, a first integrated circuit device electrically attached to the substrate, a second integrated circuit device electrically attached to the first integrated circuit device, and a heat dissipation structure comprising at least one first thermally conductive structure proximate at least one of the first integrated circuit device, the second integrated circuit device, and the substrate; and a second thermally conductive structure disposed over the at least one first thermally conductive structure, the first integrated circuit device, and the second integrated circuit device, wherein the at least one first thermally conductive structure has a lower electrical conductivity than an electrical conductivity of the second thermally conductive structure. In one embodiment, at least one first thermally conductive structure may be formed by an additive process. In another embodiment, at least one first thermally conductive structure may be pre-formed and attached to at least one of the first integrated circuit device, the second integrated circuit device, and the substrate.

In the production of integrated circuit packages, integrated circuit devices are generally mounted on substrates, which provide electrical communication routes between the integrated circuit devices and/or with external components. As shown in FIG. 1, an integrated circuit stacked structure 100 may comprise a plurality of integrated circuit devices (illustrated as first integrated circuit device $110_1$, and second integrated circuit device $110_2$), such as microprocessors, chipsets, graphics devices, wireless devices, memory devices, application specific integrated circuits, combinations thereof, stacks thereof, or the like, attached to a substrate 120, such as an interposer, a printed circuit board, a motherboard, and the like. As illustrated, the substrate 120 may include a recess 124 formed to extend into the substrate 120 from a first surface 122 (also known as the "die side") thereof and the first integrated circuit device $110_1$ may be at least partially disposed in the recess 124. The first integrated circuit device $110_1$ may be electrically attached to the substrate 120 within the recess 124 through a first plurality of device-to-substrate interconnects $132_1$, such as reflowable solder bumps or balls, in a configuration generally known as a flip-chip or controlled collapse chip connection ("C4") configuration. The first plurality of device-to-substrate interconnects $132_1$ may extend from bond pads $134_1$ on a first surface $112_1$ of the first integrated circuit device $110_1$ and bond pads $136_1$ on a bottom surface 126 of the recess 124 of the substrate 120. The integrated circuit device bond pads $134_1$ of first integrated circuit device $110_1$ may be in electrical communication with circuitry (not shown) within the first integrated circuit device $110_1$, such as with through-silicon vias 116.

As further shown in FIG. 1, the second integrated circuit device $110_2$ may be attached to the first surface 122 of the substrate 120 through a second plurality of device-to-substrate interconnects $132_2$, such as reflowable solder bumps or balls. The second plurality of device-to-substrate interconnects $132_2$ may extend from bond pads $134_2$ on a first surface $112_2$ of the second integrated circuit device $110_2$ and bond pads $136_2$ on the first surface 122 of the substrate 120. A solder resist material 148 may also be patterned on the first surface 122 of the substrate 120 to assist in the containment and attachment of the second plurality of device-to-substrate interconnects $132_2$. The bond pads $134_2$ of the second integrated circuit device $110_2$ may be in electrical communication with circuitry (not shown) within the second integrated circuit device $110_2$. The substrate 120 may include at least one conductive route 140 extending therethrough or thereon to form electrical connections between the first integrated circuit device $110_1$ and the second integrated circuit device $110_2$ and/or from the integrated circuit devices $110_1$, $110_2$ to external components (not shown).

The first integrated circuit device $110_1$ and the second integrated circuit device $110_2$ may be electrically attached to one another through a first plurality of high-density device-to-device interconnects $152_1$. As used herein, the term "high density" is relative to the device-to-substrate interconnects $132_1$ and $132_2$, which have a greater pitch than the first plurality of high-density device-to-device interconnects $152_1$. In some embodiments, the first plurality of high density device-to-device interconnects $152_1$ may be fabricated using a modified semi-additive process or a semi-additive build-up process with advanced lithography (with small vertical interconnect features formed by advanced laser or lithography processes), as will be understood to those skilled in the art, while the device-to-substrate interconnects $132_1$ and $132_2$ may be fabricated using a lower density process, such as a standard subtractive process using etch chemistry to remove areas of unwanted conductive material and forming coarse vertical interconnect features by a standard laser process. The first plurality of high-density device-to-device interconnects $152_1$ may comprise high-density bond pads 154 on the first surface $112_2$ of the second integrated circuit device $110_2$ and high-density bond pads 156 on a second surface $114_1$ of the first integrated circuit device $110_1$ with solder balls 158 extending therebetween.

The substrate 120 may be primarily composed of an appropriate dielectric material, including, but not limited to, bismaleimide triazine (BT) resin, fire retardant grade 4 (FR-4) material, polyimide materials, glass reinforced epoxy matrix material, low-k and ultra low-k dielectrics (e.g. carbon-doped dielectrics, fluorine-doped dielectrics, porous dielectrics, and organic polymeric dielectric), and the like, as well as laminates or multiple layers thereof. The substrate conductive routes 140, also known as metallization, may be composed of any conductive material, including but not limited to metals, such as copper, silver, gold, nickel, and aluminum, and alloys thereof. As will be understood to those skilled in the art, the substrate conductive routes 140 may be formed as a plurality of conductive traces $142_1$, $142_2$, and $142_3$ formed on layers of dielectric material $146_1$, $146_2$, $146_3$, $146_4$, which are electrically connected by conductive vias $144_1$, $144_2$, $144_3$, $144_4$. Furthermore, the substrate 120 may be either a cored or a coreless substrate.

In an embodiment of the present description, one or more of the conductive routes 140 in the substrate 120 may extend between the bond pads $136_2$ at the first surface 122 of the substrate 120 and external connection bond pads 138 at a second surface 128 of the substrate 120. In an embodiment of the present description, one or more of the conductive routes 140 in the substrate 120 may extend between bond pads $136_1$ at the bottom surface 126 of the recess 124 and external connection bond pads 138 at the second surface 128 of the substrate 120. In some embodiments, one or more of the conductive routes 140 in the substrate 120 may extend between bond pads $136_2$ at the first surface 122 of the substrate 120 and bond pads $136_1$ at the bottom surface 126 of the recess 124.

The device-to-substrate interconnects $132_1$, $132_2$ and the first plurality of high-density device-to-device interconnects $152_1$ can be made of any appropriate material, including, but not limited to, solders materials. The solder materials may be any appropriate material, including, but not limited to, tin, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. When the first integrated circuit device $110_1$ is attached to the substrate 120 with device-to-substrate interconnects $132_1$ made of solder, when the second integrated circuit device $110_2$ is attached to the substrate 120 with device-to-substrate interconnects $132_2$ made of solder, and/or when the second integrated circuit device $110_2$ is attached to the first integrated circuit device $110_1$ with the first plurality of high density device-to-device interconnects $152_1$ made of solder, the solder is reflowed, either by heat, pressure, and/or sonic energy to secure the solder therebetween.

Figure 2:
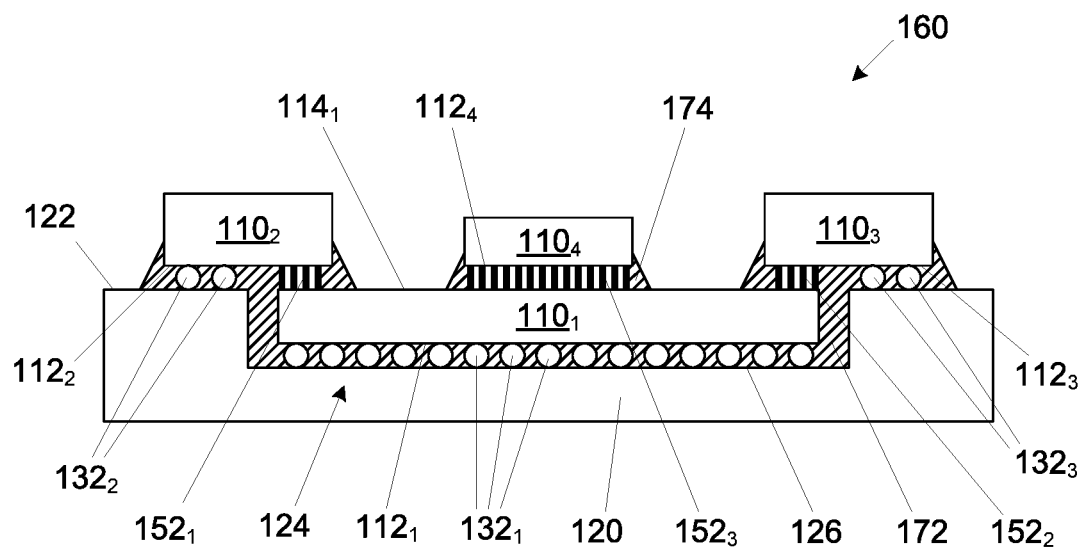
FIG. 2 is a side cross-sectional view of an electronic assembly having stacked integrated circuit devices, according to an embodiment of the present description.

FIG. 2 illustrates an electronic assembly having stacked integrated circuit devices. As shown in FIG. 2, the structure of FIG. 1 may be formed within an electronic assembly 160. The electronic assembly 160 may further include additional integrated circuit devices, i.e. a third integrated circuit device $110_3$ and a fourth integrated circuit device $110_4$. In one embodiment, as discussed with regard to the second integrated circuit device $110_2$, the third integrated circuit device $110_3$ may be attached to the first surface 122 of the substrate 120 through a third plurality of device-to-substrate interconnects $132_3$, such as reflowable solder bumps or balls. The third plurality of device-to-substrate interconnects $132_3$ may extend from bond pads (not shown) on a first surface $112_3$ of the third integrated circuit device $110_3$ and bond pads (not shown) on the first surface 122 of the substrate 120. The bond pads (not shown) of the third integrated circuit device $110_3$ may be in electrical communication with circuitry (not shown) within the third integrated circuit device $110_3$. The first integrated circuit device $110_1$ and the third integrated circuit device $110_3$ may be electrically attached to one another through a second plurality of high-density interconnects $152_2$, in the manner previously discussed. In a further embodiment of the present description, a first surface $112_4$ of the fourth integrated circuit device $110_4$ may be attached to the second surface $114_1$ of the first integrated circuit device $110_1$ through a third plurality of high-density interconnects $152_3$.

It is further understood that a first underfill material 172, such as an epoxy material, may be disposed between the first surface $112_1$ of the first integrated circuit device $110_1$ and the bottom surface 126 of the recess 124 of the substrate 120 and surround the first plurality of device-to-substrate interconnects $132_1$. The first underfill material 172 is further disposed between the first surface $112_2$ of the second integrated circuit device $110_2$ and the first surface 122 of the substrate 120 to surround the second plurality of device-to-substrate interconnects $132_2$ and disposed between the first surface $112_2$ of the second integrated circuit $110_2$ and at least a portion of the second surface $114_1$ of first integrated circuit device $110_1$ to surround the first plurality of high-density interconnects $152_1$. The first underfill material 172 is still further disposed between the first surface $112_3$ of the third integrated circuit device $110_3$ and the first surface 122 of the substrate 120 to surround the second plurality of device-to-substrate interconnects $132_3$ and disposed between the first surface $112_3$ of the third integrated circuit $110_3$ and at least a portion of the second surface $114_1$ of the first integrated circuit device $110_1$ to surround the second plurality of high-density interconnects $152_2$. A second underfill material 174, such as an epoxy material, may be disposed between the second surface $114_1$ of the first integrated circuit device $110_1$ and the first surface $112_4$ of the fourth integrated circuit device $110_4$ to surround the third plurality of high-density interconnects $152_3$. The first underfill material 172 and the second underfill material 174 may provide structural integrity and may prevent contamination, as will be understood to those skilled in the art.

It is understood that the electronic assembly 160 of FIG. 2 may have any appropriate number of integrated circuit devices (e.g. elements $110_1$-$110_4$) in any appropriate arrangement. For example, FIGS. 3-8 are top views of exemplary arrangements of a plurality of integrated circuit devices in various electronic assemblies 160, in accordance with embodiments of the present description, and which may be referred to as omni-directional interconnect (ODI) integration schemes. For the purpose of clarity, the substrate 120 has not been illustrated in FIGS. 3-8. However, it is understood that in some embodiment at least one of the plurality of integrated circuit devices 110A, 110B, 110C may be at least partially disposed in one or more recesses 124 in the substrate 120 (such as shown in FIG. 2). In other embodiments, none of the plurality of integrated circuit devices 110A, 110B, 110C may be disposed in one or more recesses 124 in the substrate 120 (such as shown in FIG. 2). In the arrangements shown in FIGS. 3-8, the integrated circuit devices 110A, 110B, 110C may include any suitable circuitry. For example, in some embodiments, the integrated circuit device 110A may be an active or passive die, and the integrated circuit devices 110B may include input/output circuitry, high bandwidth memory, and/or enhanced dynamic random-access memory (EDRAM).

Figure 3:
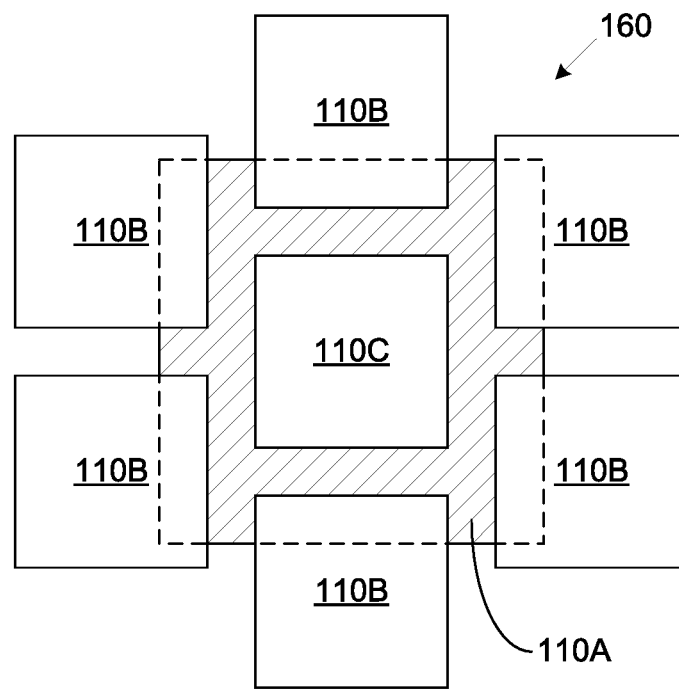
FIGS. 3-8 are top plan views of exemplary arrangements of a plurality of integrated circuit devices in various electronic assemblies, according to various embodiments of the present description.

As shown in FIG. 3, at least one integrated circuit device 110A may be positioned below a plurality of integrated circuit devices (illustrated as edge integrated circuit devices 110B and central integrated circuit device 110C). The integrated circuit device 110A may act as a bridging device and may be connected to the substrate 120 (not shown for clarity—see FIG. 2) in any manner previously disclosed herein with reference to the integrated circuit device $110_1$. The integrated circuit devices 110B may span the substrate 120 (see FIG. 2) and span at least a portion of the integrated circuit device 110A (e.g., in any manner disclosed herein with reference to the integrated circuit devices $110_2$ and $110_3$ of FIG. 2). FIG. 3 also illustrates an integrated circuit device 110C disposed on the integrated circuit device 110A (e.g., in the manner disclosed herein with reference to the integrated circuit device $110_3$ of FIG. 2). In FIG. 3, the integrated circuit devices 110B may "overlap" the edges and/or the corners of the integrated circuit device 110A, while the integrated circuit device 110C may be entirely above the integrated circuit device 110A. Placing the integrated circuit devices 110B at least partially over the corners of the integrated circuit device 110A may reduce routing congestion in the integrated circuit device 110A and may improve utilization of the integrated circuit device 110A (e.g., in case the number of input/outputs needed between the integrated circuit device 110A and the integrated circuit devices 110B is not large enough to require the full edge of the integrated circuit device 110A).

Figure 4:
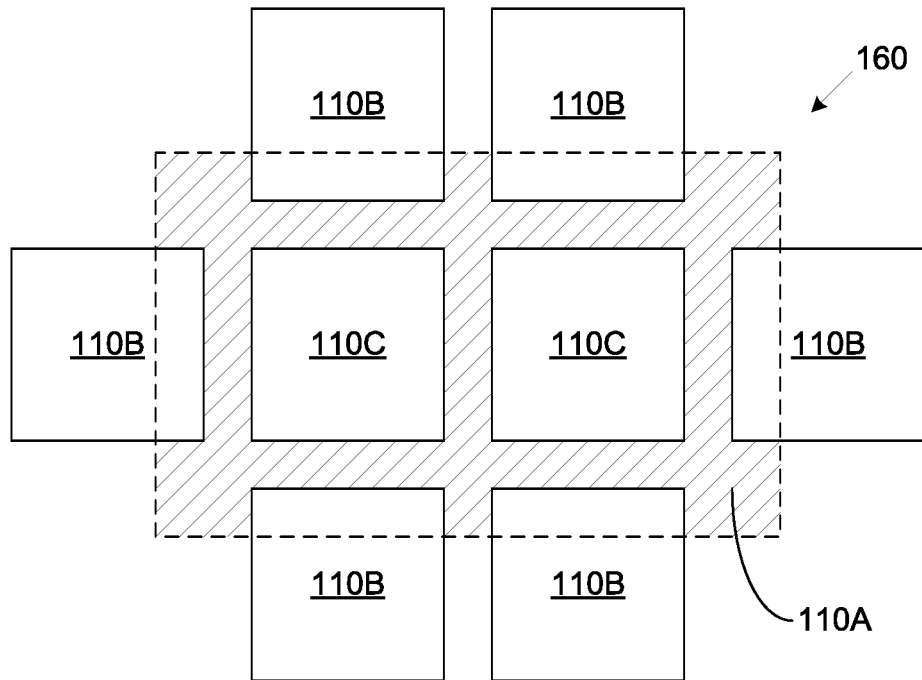

FIG. 4 also illustrates an arrangement in which the integrated circuit device 110A is disposed below multiple different integrated circuit devices 110B. The integrated circuit device 110A may be connected to the substrate 120 (not shown) in any manner disclosed herein with reference to the integrated circuit device $110_1$, while the integrated circuit devices 110B may span the substrate 120 (not shown) and the integrated circuit device 110A (e.g., in any manner disclosed herein with reference to the integrated circuit devices $110_2$ and $110_3$). FIG. 4 also illustrates two integrated circuit devices 110C disposed on the integrated circuit device 110A (e.g., in the manner disclosed herein with reference to the integrated circuit device $110_4$). In FIG. 4, the integrated circuit devices 110B "overlap" the edges of the integrated circuit device 110A, while the integrated circuit devices 110C are wholly above the integrated circuit device 110A. In the embodiment of FIG. 4, the integrated circuit devices 110B and 110C may be arranged in a portion of a rectangular array.

Figure 5:
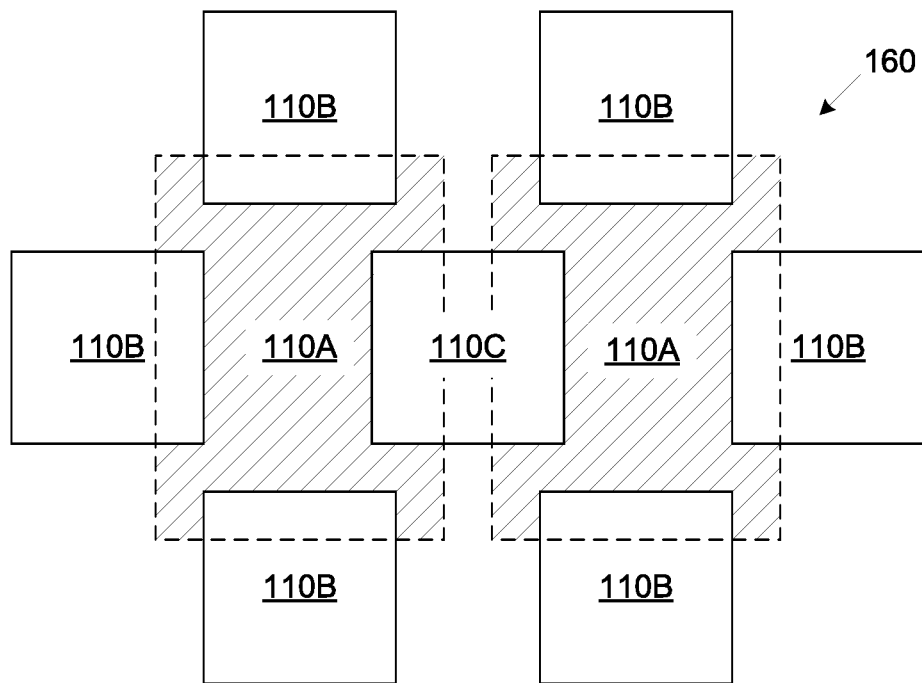

FIG. 5 illustrates an embodiment wherein two integrated circuit devices 110A may take the place of the single integrated circuit device 110A illustrated in FIG. 4, and one or more integrated circuit devices 110C may "bridge" the two integrated circuit devices 110A.

Figure 6:
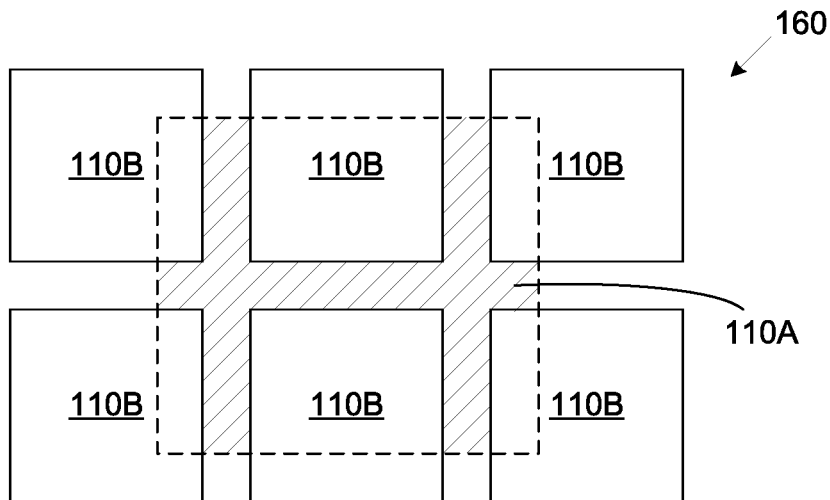

FIG. 6 illustrates an arrangement in which the integrated circuit device 110A is disposed below multiple different integrated circuit devices 110B. The integrated circuit device 110A may be connected to a substrate 120 (not shown) in any manner disclosed herein with reference to the integrated circuit device $110_1$, while the integrated circuit devices 110B may span the substrate 120 and the integrated circuit device 110A (e.g., in any manner disclosed herein with reference to the integrated circuit device $110_2$ and $110_3$). In FIG. 6, the integrated circuit devices 110B "overlap" the edges and/or the corners of the integrated circuit device 110A. In the embodiment of FIG. 6, the integrated circuit devices 110B may be arranged in a portion of a rectangular array.

Figure 7:
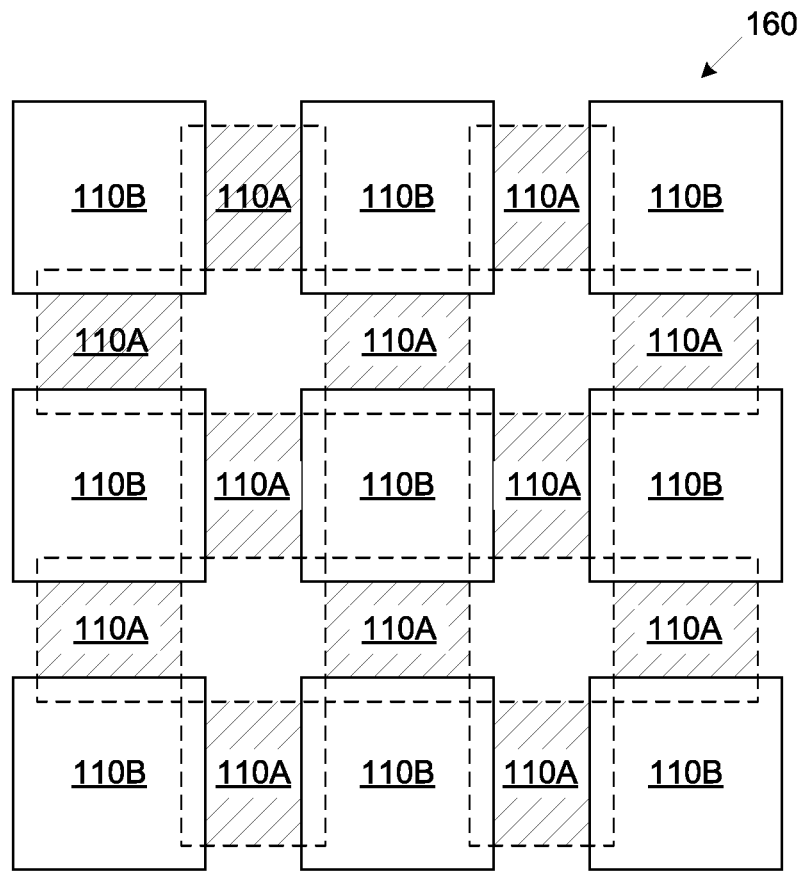

FIG. 7 illustrates an arrangement in which multiple integrated circuit devices 110A are disposed below multiple different integrated circuit devices 110B such that each integrated circuit device 110A bridges two or more horizontally or vertically adjacent integrated circuit devices 110B. The integrated circuit devices 110A may be connected to a substrate 120 (not shown) in any manner disclosed herein with reference to the integrated circuit device $110_1$ of FIG. 2, while the integrated circuit devices 110B may span the substrate 120 (not shown) and the integrated circuit device 110A (e.g., in any manner disclosed herein with reference to the integrated circuit device $110_2$ of FIG. 2). In FIG. 7, the integrated circuit devices 110B "overlap" the edges of the adjacent integrated circuit devices 110A.

Figure 8:
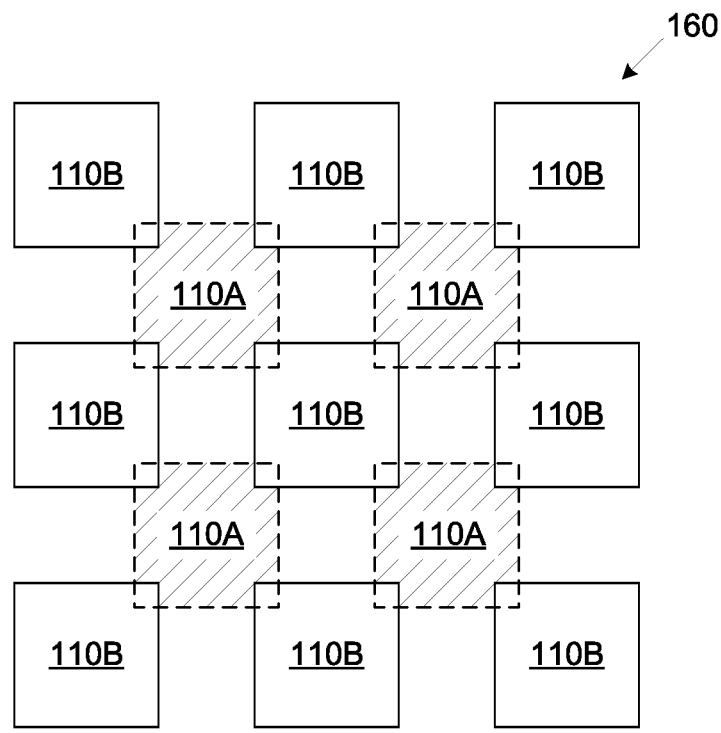

FIG. 8 illustrates an arrangement in which multiple integrated circuit devices 110A are disposed below multiple different integrated circuit devices 110B such that each integrated circuit device 110A bridges the four diagonally adjacent integrated circuit devices 110B. The integrated circuit devices 110A may be connected to the substrate 120 (not shown) in any manner disclosed herein with reference to the integrated circuit device $110_1$ of FIG. 2, while the integrated circuit devices 110B may span the substrate 120 and the integrated circuit device 110A (e.g., in any manner disclosed herein with reference to the integrated circuit devices $110_2$ and $110_3$ of FIG. 2). In FIG. 8, the integrated circuit devices 110B "overlap" the corners of the adjacent integrated circuit devices 110A.

Figure 9:
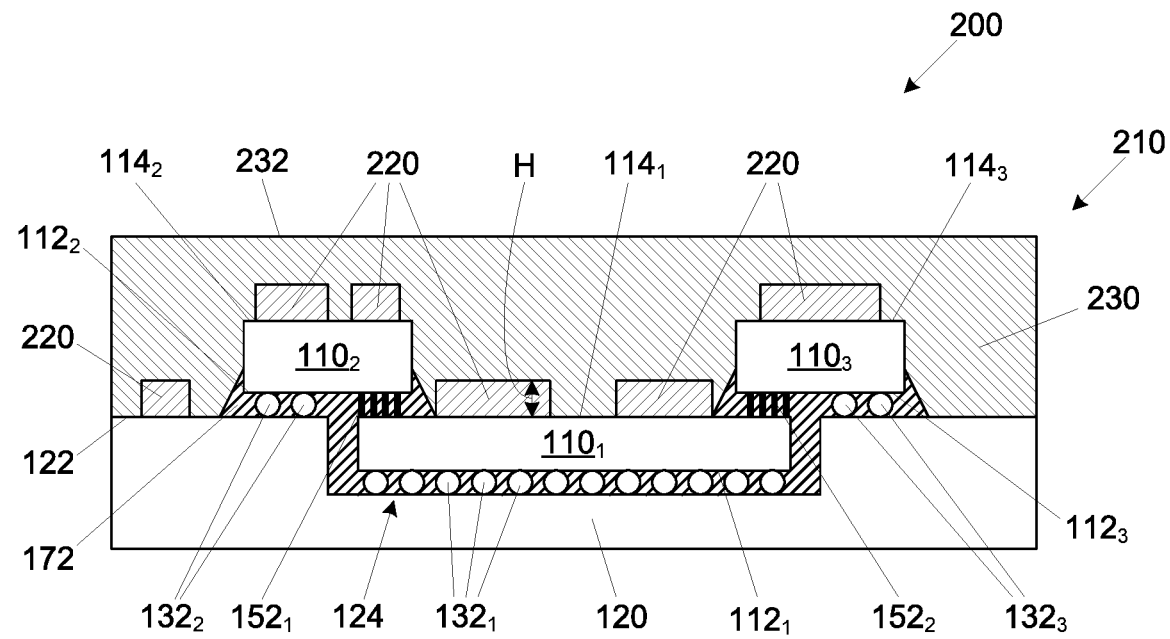
FIGS. 9-11 are side cross-sectional views of integrated circuit device structures having heat dissipation devices that comprise two different thermally conductive structures having differing electrical conductivities to reduce inductive coupling between integrated circuit devices within the integrated circuit device structures, according to one embodiment of the present description.

FIG. 9 illustrates an embodiment of the electronic assembly 200 having the first integrated circuit device $110_1$, second integrated circuit device $110_2$, and the third integrated circuit device $110_3$ attached to the substrate 120. The electronic assembly 200 of FIG. 9 may have a similar or the same structure as the electronic assembly 160 of FIG. 2, and, thus, for the purposes of brevity and conciseness, the description of the components thereof will not be repeated. As shown in FIG. 9, a heat dissipation device 210 may be fabricated to remove heat from the first integrated circuit device $110_1$, second integrated circuit device $110_2$, and the third integrated circuit device $110_3$. The heat dissipation device 210 may comprise at least one first thermally conductive structure 220 proximate the substrate 120 and/or any of the integrated circuit devices, e.g. the first integrated circuit device $110_1$, second integrated circuit device $110_2$, and the third integrated circuit device $110_3$, and a second thermally conductive structure 230 disposed over the at least one first thermally conductive structure 220, the first integrated circuit device $110_1$, second integrated circuit device $110_2$, and the third integrated circuit device $110_3$. The second thermally conductive structure 230 may be fabricated such that it has a substantially planar surface 232 for the attached of an additional heat dissipation device, including but not limited to a heat pipe, a high surface area dissipation structure with a fan (such as a structure having fins or pillars/columns formed in a thermally conductive structure), a liquid cooling device, and the like, which removes heat from the second thermally conductive structure 230, as will be understood to those skilled in the art.

The first thermally conductive structure(s) 220 may be specifically positioned and made from materials which reduce or substantially eliminate inductive coupling between the integrated circuit devices, e.g. the first integrated circuit device $110_1$, second integrated circuit device $110_2$, and the third integrated circuit device $110_3$. It is understood that a height H of the first thermally conductive structure(s) 220 may adjusted to block the inductive coupling between the integrated circuit devices.

In one embodiment, the first thermally conductive structures 220 may be made of a material that has a lower electrical conductivity than an electrical conductivity of the second thermally conductive structure 230. In an embodiment, the material used to form the first thermally conductive structures 220 may comprise any appropriate material, including, but not limited to, epoxies with high thermal conductivity fillers, such as alumina particles. In one embodiment, the first thermally conductive structures 220 may have an electrical resistivity of between about $10^3$ and $10^{10}$ ohm·cm.

The first thermally conductive structures 220 may be made by any appropriate process. In one embodiment, the first thermally conductive structures 220 may be made by an additive process, such screen printing. In another embodiment, the first thermally conductive structures 220 may be made by a molding process (transfer or compression molding), wherein a desire pattern is formed and then cured. In a further embodiment, the first thermally conductive structures 220 may be formed to abut the second surface of the integrated circuit devices, such as the second surface $114_1$ of the first integrated circuit device $110_1$, a second surface $114_2$ of the second integrated circuit device $110_2$, and a second surface $114_3$ of the third integrated circuit device $110_3$. In a still further embodiment, the first thermally conductive structures 220 may be formed to abut the substrate 120.

The second thermally conductive structure 230 may be made by any appropriate process. In one embodiment, the second thermally conductive structure 230 may be made by an additive deposition process, such a cold-spray process, wherein material powders are accelerated through a nozzle at high speeds, such that a mechanical bond is formed upon impact with the surface onto which material powders are being deposited. In an embodiment of the present description, the second thermally conductive structure 230 may be made from metals, such as copper, aluminum, and alloys thereof, from metal/ceramic composites, such as aluminum/aluminum oxide, or from any other appropriate materials and combinations thereof. In one embodiment of the present description, the second thermally conductive structures 230 may have an electrical resistivity of less than about $10^3$ ohm·cm.

Figure 10:
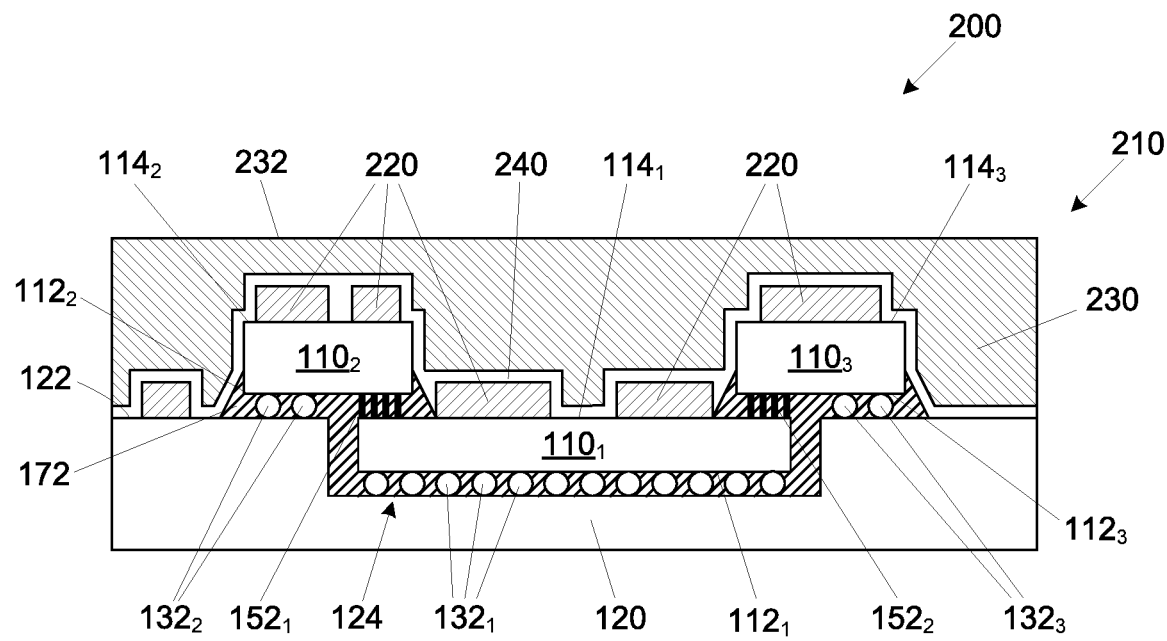

Some additive manufacturing methods, such as a cold-spray process, that may be used to form the second thermally conductive structure 230, may cause ablation of the underlying components, such as the first thermally conductive structures 220, the substrate 120, the integrated circuit devices $110_1$, $110_2$, $110_3$, and/or the underfill materials 172. Thus, as shown in FIG. 10, a liner layer 240 may be formed over the underlying components prior to the deposition of the second thermally conductive structure 230. The liner layer 240 may be formed by any appropriate hard and durable material, including, but not limited to, metal, ceramic, inorganic materials, or combinations thereof. In one embodiment, the liner layer 240 may be copper, titanium, or alloys thereof. In another embodiment, the liner layer 240 may be a dielectric layer, such as aluminum nitride or aluminum dioxide. The liner layer 240 may be formed by any appropriate method, including, but not limited to, atomic layer deposition (ALD), chemical vapor deposition (CVD), such as plasma enhanced chemical vapor deposition (PECVD) and metal-organic chemical vapor deposition (MOCVD), and physical vapor deposition (PVD).

Figure 11:
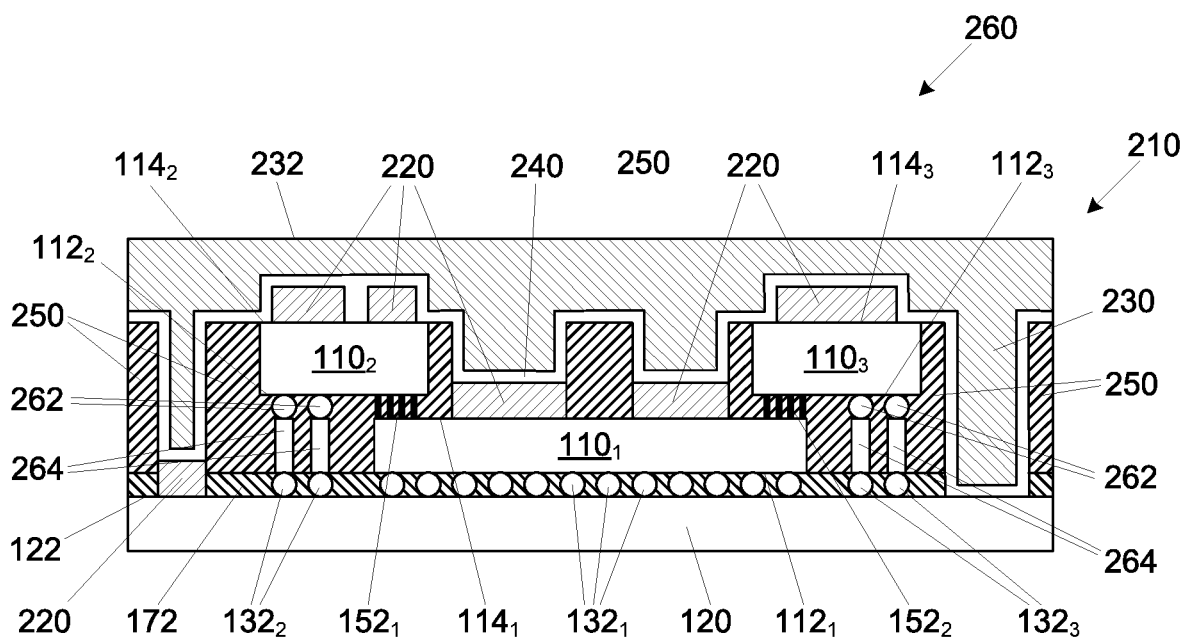

Although some embodiments illustrated in the present description have at least one integrated circuit device, such as integrated circuit device $110_1$ within recess 124 (see FIG. 2) in the substrate 120, the embodiment are not so limited. As shown in FIG. 11, the integrated circuit devices $110_1$-$110_3$ may be configured, stacked, or disposed in a mold material 250 to form a molded package 260, and attached in a manner such that a recess is not necessary. As shown, the molded package 260 may include the first integrated circuit device $110_1$ attached to the first surface 122 of the substrate 120 through the first plurality of device-to-substrate interconnects $132_1$. The second integrated circuit device $110_2$ may be attached to the first surface 122 of the substrate 120 through the second plurality of device-to-substrate interconnects $132_2$ which are electrically attached to through-mold interconnects 264 and device interconnects 262 within the molded package 260. The third integrated circuit device $110_3$ may be attached to the first surface 122 of the substrate 120 through the third plurality of device-to-substrate interconnects $132_3$ which are also electrically attached to through-mold interconnects 264 and device interconnects 262 within the molded package 260. The processes for the fabrication of a molded package 260 are well known in the art and for purposes of brevity and conciseness will not be described herein.

The first integrated circuit device $110_1$ and the second integrated circuit device $110_2$ may be electrically attached to one another through the first plurality of high-density interconnects $152_1$. Furthermore, the first integrated circuit device $110_1$ and the third integrated circuit device $110_3$ may be electrically attached to one another through the second plurality of high-density interconnects $152_2$.

As previously discussed, the underfill material 172 may be disposed between the first surface $112_1$ of the first integrated circuit device $110_1$ and the first surface 122 of the substrate 120 and may surround the first plurality of device-to-substrate interconnects $132_1$. The first underfill material 172 is further disposed between the mold material 250 and the first surface 122 of the substrate 120 to surround the second plurality of device-to-substrate interconnects $132_2$ and to surround the third plurality of device-to-substrate interconnects $132_3$.

Figure 12:
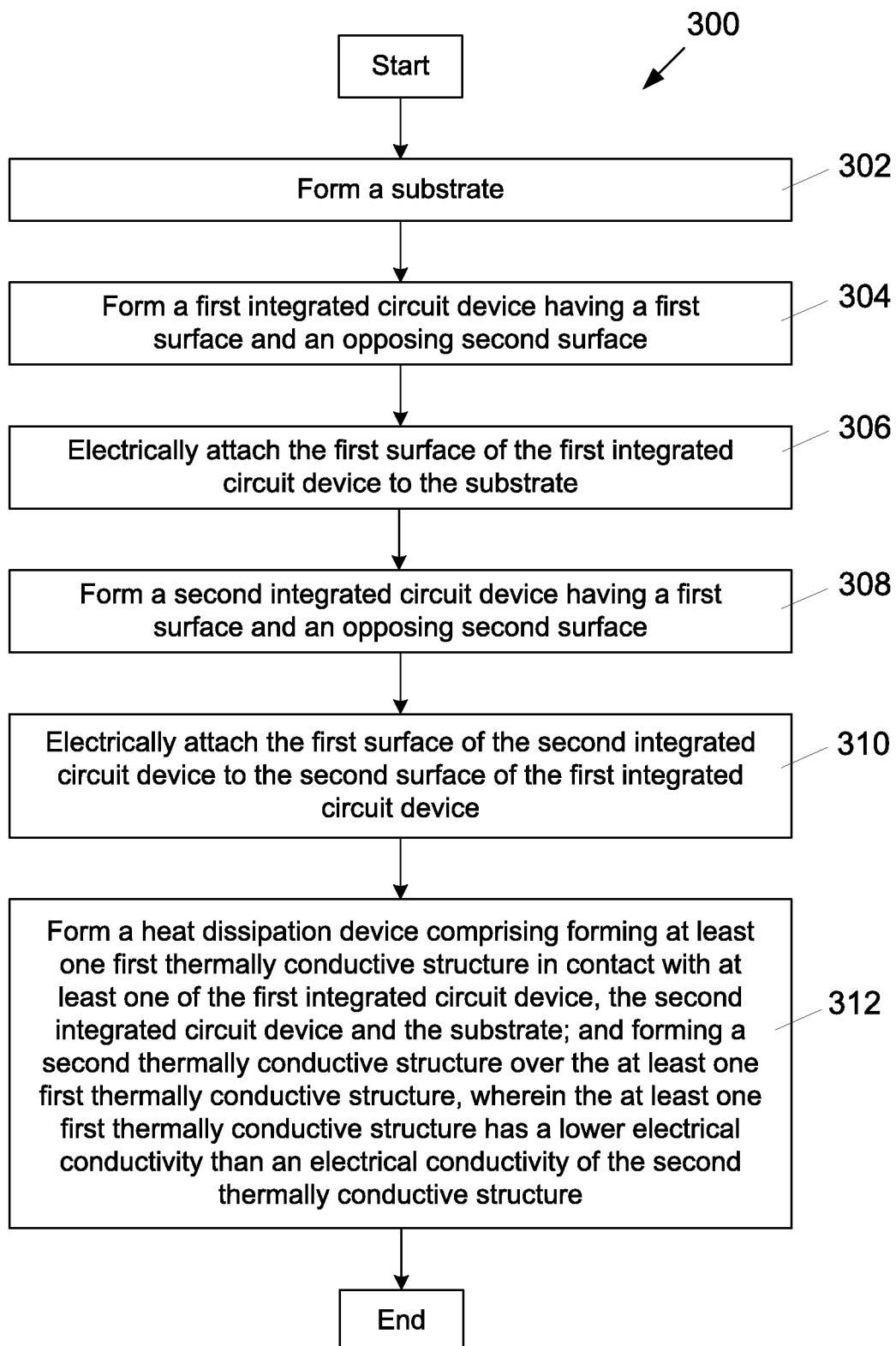
FIG. 12 is a flow chart of a process for fabricating an integrated circuit structure, according to the present description.

FIG. 12 is a flow chart of a process 300 of fabricating an integrated circuit structure according to an embodiment of the present description. As set forth in block 302, a substrate may be formed. A first integrated circuit device may be formed having a first surface and an opposing second surface, as set forth in block 304. As set forth in block 306, the first surface of the at least one integrated circuit device may be electrically attached to the substrate. A second integrated circuit device may be formed having a first surface and an opposing second surface, as set forth in block 308. As set forth in block 310, the first surface of the second integrated circuit device may be electrically attached to the second surface of the first integrated circuit device. A heat dissipation device may be formed by forming at least one first thermally conductive structure in contact with at least one of the first integrated circuit device, the second integrated circuit device, and the substrate; and forming a second thermally conductive structure over the at least one first thermally conductive structure, wherein the at least one first thermally conductive structure has a lower electrical conductivity than an electrical conductivity of the second thermally conductive structure, as set forth in block 312.

Figure 13:
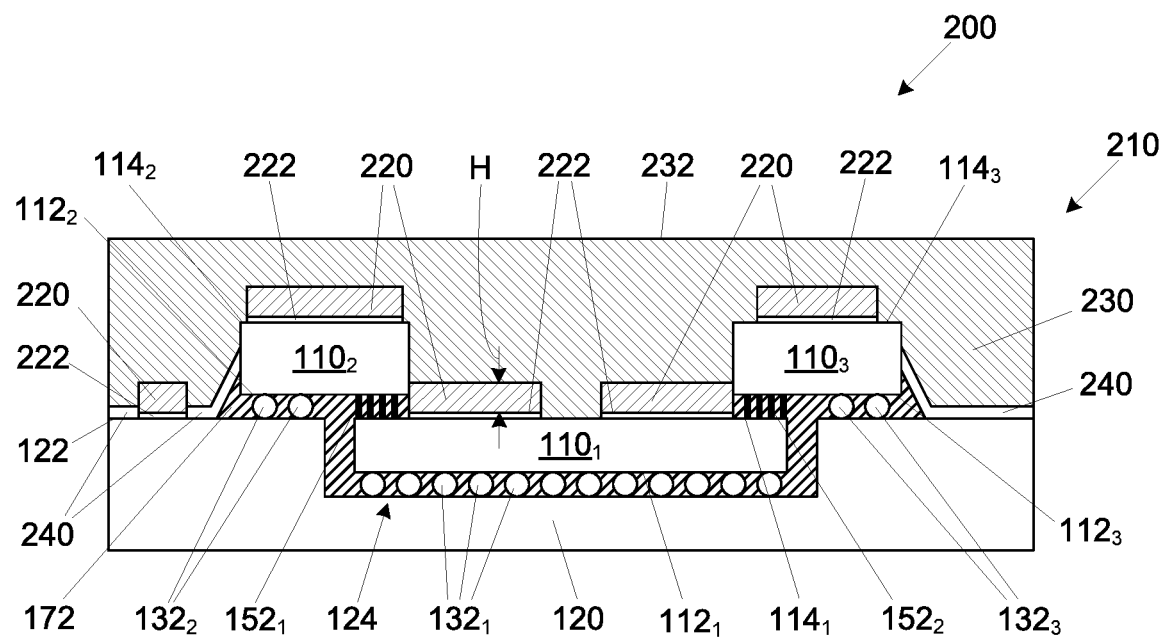
FIGS. 13 and 14 are side cross-sectional views of integrated circuit device structures having heat dissipation devices that comprise two different thermally conductive structures having differing electrical conductivities to reduce inductive coupling between integrated circuit devices within the integrated circuit device structures, according to one embodiment of the present description.

FIG. 13 illustrates an embodiment of the electronic assembly 200 having the first integrated circuit device $110_1$, second integrated circuit device $110_2$, and the third integrated circuit device $110_3$ attached to the substrate 120. The electronic assembly 200 of FIG. 13 may have a similar or the same components as the electronic assembly 200 of FIG. 9, and, thus, for the purposes of brevity and conciseness, the description of the components thereof will not be repeated. As shown in FIG. 13 and similar to FIG. 9, the heat dissipation device 210 may comprise at least one first thermally conductive structure 220 proximate any of the integrated circuit devices, e.g. the first integrated circuit device $110_1$, second integrated circuit device $110_2$, and the third integrated circuit device $110_3$, and a second thermally conductive structure 230 disposed over the at least one first thermally conductive structure 220, the first integrated circuit device $110_1$, second integrated circuit device $110_2$, and the third integrated circuit device $110_3$. The first thermally conductive structures 220 may be formed and then attached to at least one of the components of the electronic assembly 200, such as the first integrated circuit device $110_1$, second integrated circuit device $110_2$, the third integrated circuit device $110_3$, and the substrate 120. As previously discussed, the first thermally conductive structure(s) 220 may be specifically positioned and made from materials which reduce or substantially eliminate inductive coupling between the integrated circuit devices, e.g. the first integrated circuit device $110_1$, second integrated circuit device $110_2$, and the third integrated circuit device $110_3$, with an adhesive material 222. As also previously discussed, the height H of the first thermally conductive structure(s) 220 may be adjusted to block the inductive coupling between the integrated circuit devices. The first thermally conductive structures 220 may be pre-formed by any appropriate process, including, but not limited to, molding, milling, and skiving.

Again, as some additive manufacturing methods, such as a cold-spray process, that may be used to form the second thermally conductive structure 230, may cause ablation of the underlying components, such as the first thermally conductive structures 220, the substrate 120, the integrated circuit devices $110_1$, $110_2$, $110_3$, and/or the underfill material 172, the liner layer 240 may be formed over underlying components prior to the deposition of the second thermally conductive structure 230. As shown in FIG. 13, as some components, such as the substrate 120 and the underfill material 172 may be particularly susceptible to damage from ablation, they may be selectively protected by patterning the liner layer 240.

Figure 14:
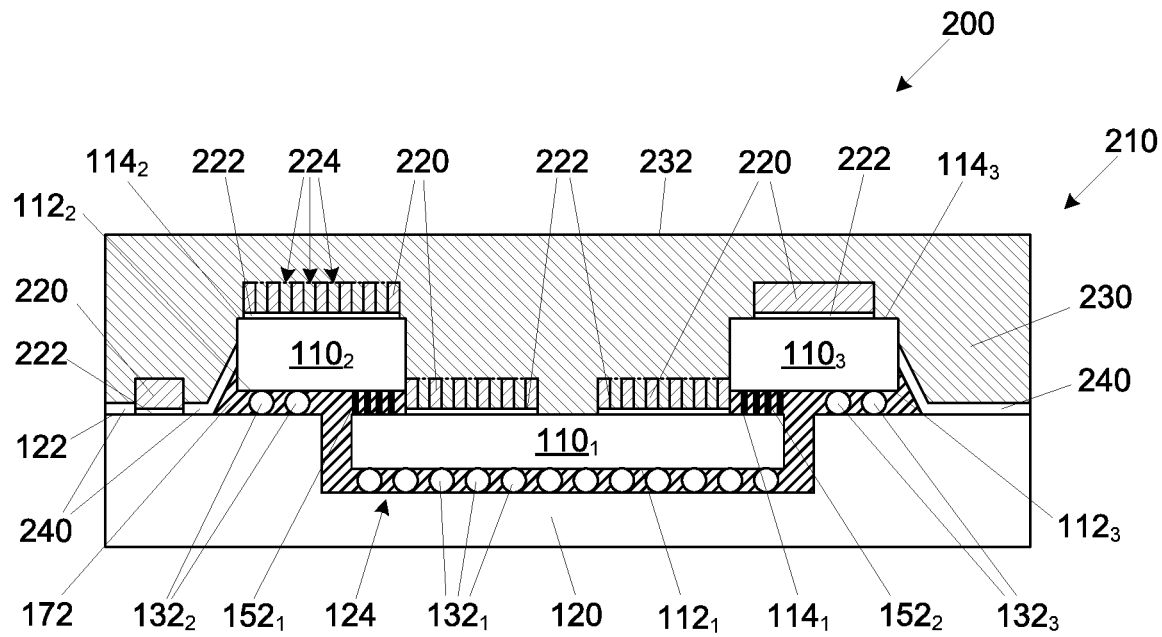

As shown in FIG. 14, the number of individual first thermally conductive structures 220 to be assembled may be reduced by patterning through-holes or openings 224 in selected locations therethrough. The second thermally conductive structures 230 may be deposited in the openings 224. The openings 224 in the first thermally conductive structures 220 may not only reduce the number of individual first thermally conductive structures 220 to be assembled, but can also improve the patterning accuracy of the second thermally conductive structures 230, as will be understood to those skilled in the art.

Figure 15:
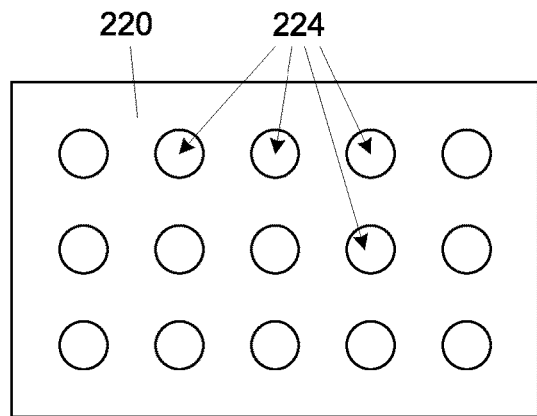
FIGS. 15 and 16 are top plan views of first thermally conductive structures of a heat dissipation device, according to another embodiment of the present description.
Figure 16:
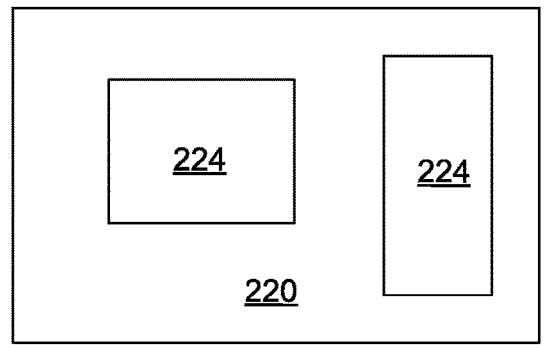

As shown in FIGS. 15 and 16, the openings 224 may have any appropriate shape or pattern. In one embodiment shown in FIG. 15, the openings 224 may be uniformly distributed and may have any appropriate cross-section, such as circular (shown), square, rectangular, triangular, and the like. In another embodiment shown in FIG. 16, the openings 224 may be specifically positioned and shaped to achieve a desired reduction or substantial elimination of inductive coupling between the integrated circuit devices, e.g. the first integrated circuit device $110_1$, second integrated circuit device $110_2$, and the third integrated circuit device $110_3$.

Figure 17:
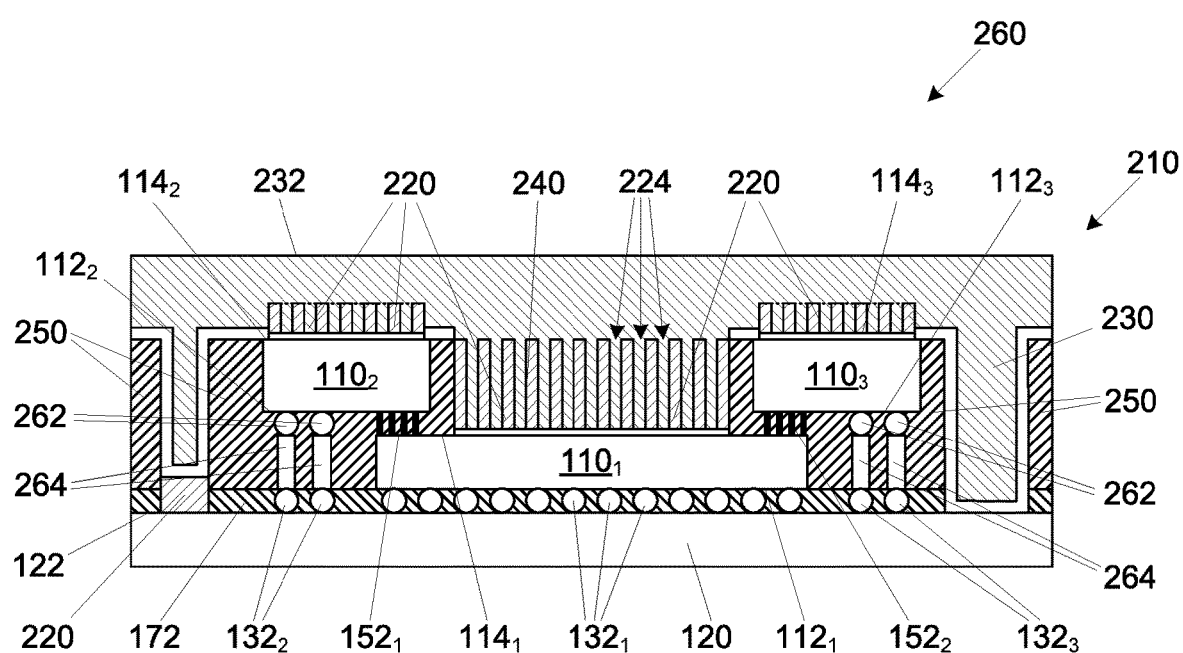
FIG. 17 is a side cross-sectional view of a molded integrated circuit device structure having a heat dissipation device which reduces inductive coupling, according to one embodiment of the present description.

Although some embodiments illustrated in FIGS. 13 and 14 of the present description have at least one integrated circuit device, such as integrated circuit device $110_1$ within recess 124 (see FIG. 2) in the substrate 120, the embodiments are not so limited. As shown in FIG. 17, the integrated circuit devices $110_1$-$110_3$ may be configurated, stacked, or disposed in a mold material 250 to form a molded package 260, such as shown and described with regard to the embodiment of FIG. 11. As the fabrication and components have already been described with regard to the embodiment of FIG. 11, for the sake of brevity and conciseness, they will not be repeated herein.

Figure 18:
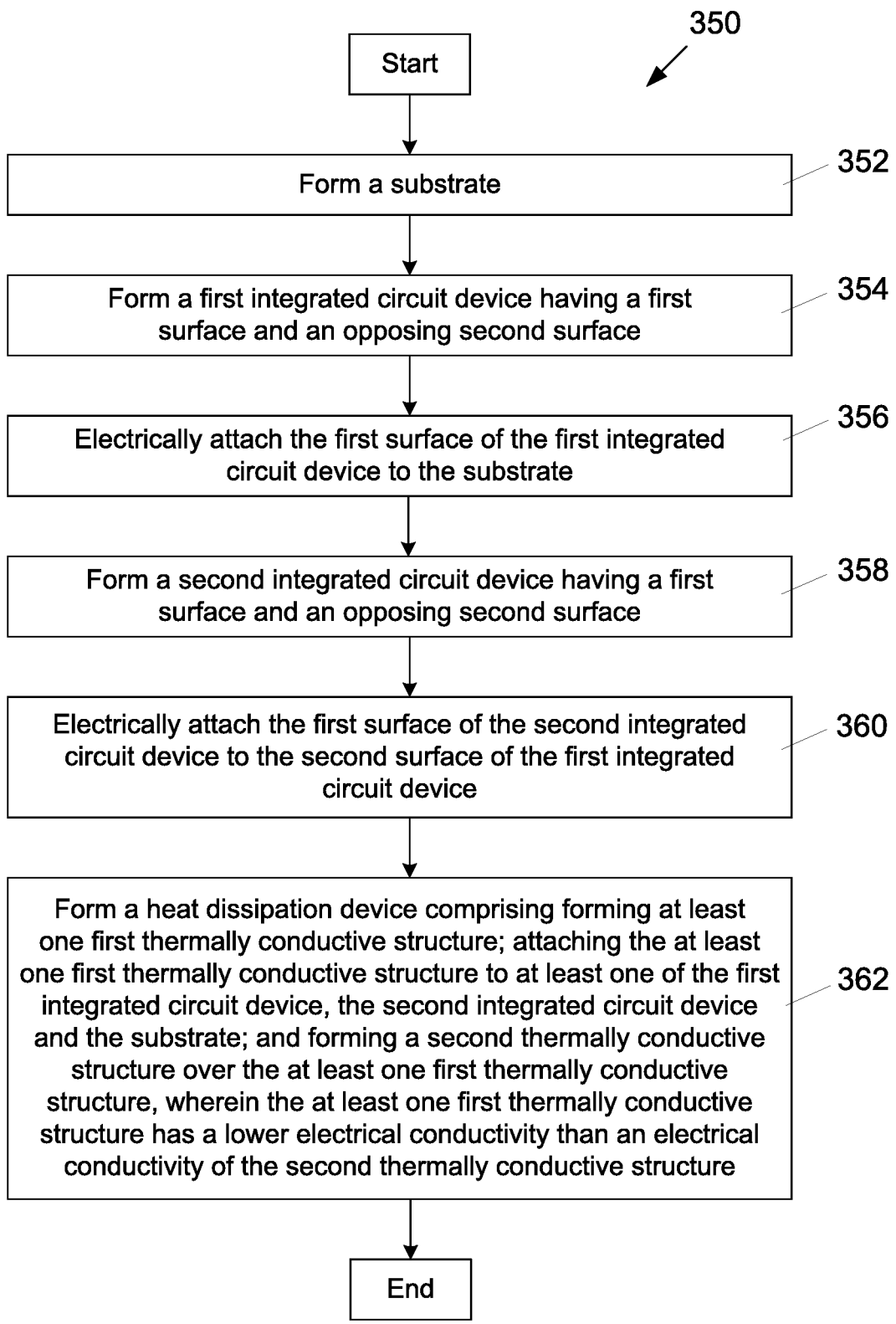
FIG. 18 is a flow chart of a process for fabricating an integrated circuit package, according to another embodiment of the present description.

FIG. 18 is a flow chart of a process 350 of fabricating an integrated circuit structure according to an embodiment of the present description. As set forth in block 352, a substrate may be formed. A first integrated circuit device may be formed having a first surface and an opposing second surface, as set forth in block 354. As set forth in block 356, the first surface of the at least one integrated circuit device may be electrically attached to the substrate. A second integrated circuit device may be formed having a first surface and an opposing second surface, as set forth in block 358. As set forth in block 360, the first surface of the second integrated circuit device may be electrically attached to the second surface of the first integrated circuit device. A heat dissipation device may be formed by forming at least one first thermally conductive structure; attaching the at least one first thermally conductive structure to at least one of the first integrated circuit device, the second integrated circuit device, and the substrate; and forming a second thermally conductive structure over the at least one first thermally conductive structure, wherein the at least one first thermally conductive structure has a lower electrical conductivity than an electrical conductivity of the second thermally conductive structure, as set forth in block 362.

Figure 19:
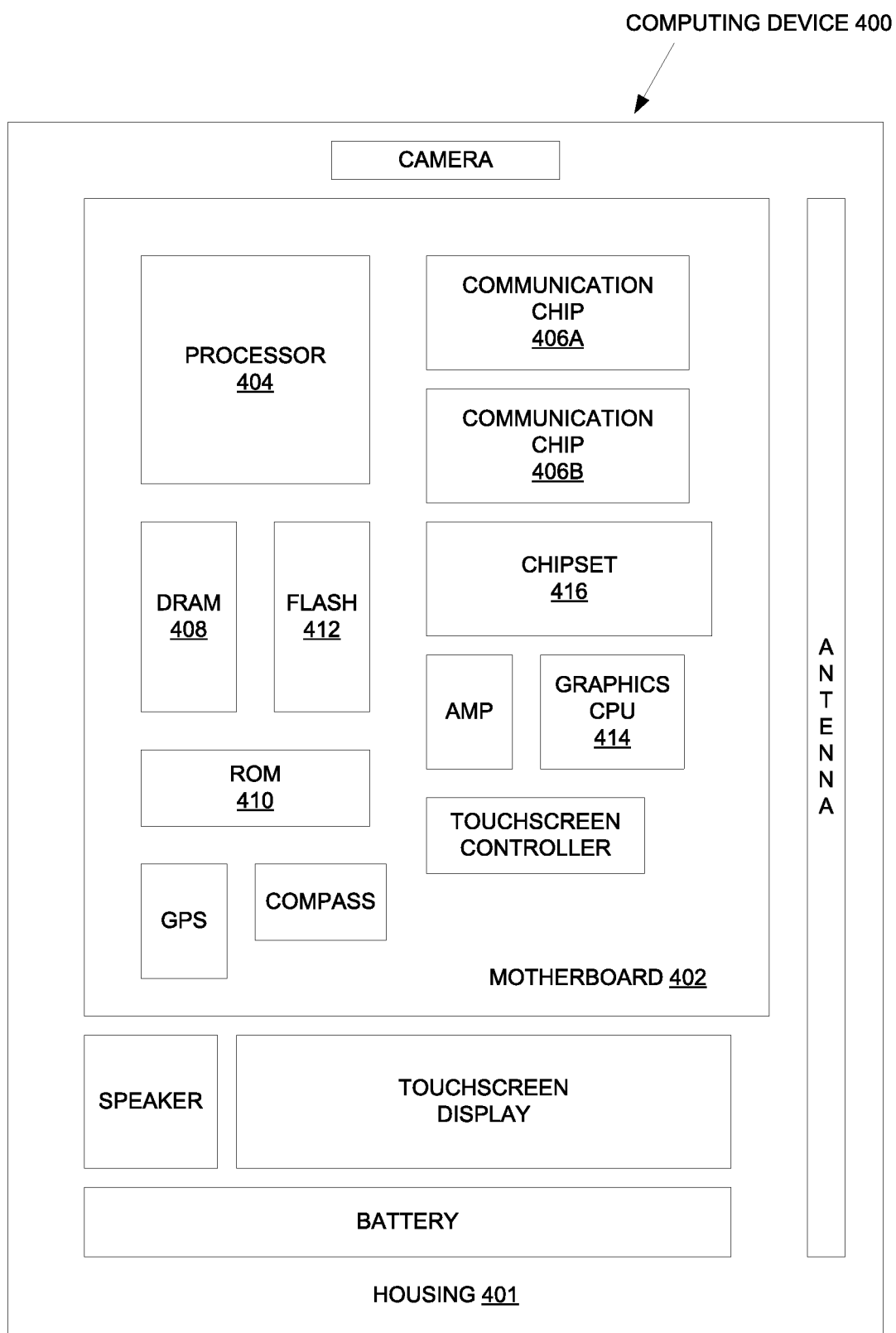
FIG. 19 is a schematic of an electronic device/system, according to an embodiment of the present description.

FIG. 19 illustrates an electronic or computing device 400 in accordance with one implementation of the present description. The computing device 400 may include a housing 401 having a board 402 disposed therein. The board 402 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly comprising a substrate; a first integrated circuit device having a first surface and an opposing second surface, wherein the first surface of the first integrated circuit device is electrically attached to the substrate; a second integrated circuit device having a first surface and an opposing second surface, wherein the first surface of the second integrated circuit device is electrically attached to the second surface of the first integrated circuit device; and a heat dissipation device comprising at least one first thermally conductive structure in thermal contact with at least one of the first integrated circuit device, the second integrated circuit device, and the substrate; and a second thermally conductive structure disposed over the at least one first thermally conductive structure, wherein the at least one first thermally conductive structure has a lower electrical conductivity than an electrical conductivity of the second thermally conductive structure.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-18. The subject matter may be applied to other integrated circuit devices and assembly applications, as well as any appropriate electronic application, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit assembly, comprising:
a substrate;
a first integrated circuit device having a first surface and an opposing second surface, wherein the first surface of the first integrated circuit device is electrically attached to the substrate;
a second integrated circuit device having a first surface and an opposing second surface, wherein the first surface of the second integrated circuit device is electrically attached to the second surface of the first integrated circuit device and, wherein the first surface of the second integrated circuit device is electrically attached to the substrate; and
a heat dissipation device comprising:
at least one first thermally conductive structure in thermal contact with at least one of the first integrated circuit device, the second integrated circuit device, and the substrate; and
a second thermally conductive structure over a non-planar surface comprising the at least one first thermally conductive structure, wherein the at least one first thermally conductive structure has a lower electrical conductivity than an electrical conductivity of the second thermally conductive structure, and wherein the second thermally conductive structure is substantially conformal to the non-planar surface and a top surface of the second thermally conductive structure is substantially planar.

2. The integrated circuit assembly of claim 1, wherein the substrate further includes a recess and wherein at least a portion of the first integrated circuit device resides within the recess.

3. The integrated circuit assembly of claim 1, further comprising a liner layer between the substrate and the second thermally conductive structure, the liner layer substantially conformal to the non-planar surface comprising the at least one first thermally conductive structure, and wherein the second thermally conductive material is substantially conformal to a non-planar surface of the liner layer.

4. The integrated circuit assembly of claim 1, further comprising a liner layer between the first thermally conductive structure and the second thermally conductive structure.

5. The integrated circuit assembly of claim 1, wherein the at least one of the first integrated circuit device and the second integrated circuit device are embedded in a mold material and wherein the non-planar surface further comprises the mold material.

6. The integrated circuit assembly of claim 5, further comprising a liner layer between the mold material and the second thermally conductive structure.

7. The integrated circuit assembly of claim 1, wherein the second thermally conductive structure is in direct contact with the non-planar surface comprising the first thermally conductive material.

8. A method of forming an integrated circuit assembly, comprising:
forming a substrate;
forming a first integrated circuit device having a first surface and an opposing second surface;
electrically attaching the first surface of the first integrated circuit device to the substrate;
forming a second integrated circuit device having a first surface and an opposing second surface;
electrically attaching the first surface of the second integrated circuit device to the second surface of the first integrated circuit device;
electrically attaching the first surface of the second integrated circuit device to the substrate; and
forming a heat dissipation device comprising:
forming at least one first thermally conductive structure in contact with at least one of the first integrated circuit device, the second integrated circuit device, and the substrate;
forming a second thermally conductive structure conformal to a non-planar surface comprising the at least one first thermally conductive structure, wherein the at least one first thermally conductive structure has a lower electrical conductivity than an electrical conductivity of the second thermally conductive structure; and
planarizing a top surface of the second thermally conductive structure.

9. The method of claim 8, further comprising forming a recess in the substrate and wherein electrically attaching the first surface of the first integrated circuit device to the substrate comprises electrically attaching the first surface of the first integrated circuit device to the substrate within the recess.

10. The method of claim 8, further comprising forming a liner layer between the substrate and the second thermally conductive structure.

11. The method of claim 8, further comprising forming a liner layer between the first thermally conductive structure and the second thermally conductive structure.

12. The method of claim 8, further comprising embedding the at least one of the first integrated circuit device and the second integrated circuit device in a mold material.

13. The method of claim 12, further comprising forming a liner layer between the mold material and the second thermally conductive structure.

14. The method of claim 8, wherein forming the second thermally conductive structure further comprises accelerating a powder to form a mechanical bond upon impact with a surface of the integrated circuit assembly exposed to the forming of the second thermally conductive structure.

15. An electronic system, comprising:
a housing;
a substrate in the housing;
a first integrated circuit device having a first surface and an opposing second surface, wherein the first surface of the first integrated circuit device is electrically attached to the substrate;
a second integrated circuit device having a first surface and an opposing second surface, wherein the first surface of the second integrated circuit device is electrically attached to the second surface of the first integrated circuit device, and wherein the first surface of the second integrated circuit device is electrically attached to the substrate; and
a heat dissipation device comprising:
at least one first thermally conductive structure in thermal contact with at least one of the first integrated circuit device, the second integrated circuit device, and the substrate; and
a second thermally conductive structure over a non-planar surface comprising the at least one first thermally conductive structure, wherein the at least one first thermally conductive structure has a lower electrical conductivity than an electrical conductivity of the second thermally conductive structure, and wherein the second thermally conductive structure is substantially conformal to the non-planar surface and a top surface of the second thermally conductive structure is substantially planar.

16. The electronic system of claim 15, wherein the substrate further includes a recess and wherein at least a portion of the first integrated circuit device resides within the recess.

17. The electronic system of claim 15, further comprising a liner layer between the substrate and the second thermally conductive structure.

18. The electronic system of claim 15, further comprising a liner layer between the first thermally conductive structure and the second thermally conductive structure.

19. The electronic system of claim 15, wherein the at least one of the first integrated circuit device and the second integrated circuit device are embedded in a mold material.

20. The electronic system of claim 15, wherein the second thermally conductive structure is in direct contact with the non-planar surface comprising the first thermally conductive material.

* * * * *